(12) United States Patent
Chen et al.

(10) Patent No.: US 10,319,747 B2
(45) Date of Patent: Jun. 11, 2019

(54) ARRAY SUBSTRATE, DISPLAY PANEL, AND DISPLAY APPARATUS

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Chuanbao Chen, Beijing (CN); Jie Yang, Beijing (CN); Xiaobin Yin, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/508,102

(22) PCT Filed: Jul. 1, 2016

(86) PCT No.: PCT/CN2016/088165
§ 371 (c)(1),
(2) Date: Mar. 1, 2017

(87) PCT Pub. No.: WO2017/121078
PCT Pub. Date: Jul. 20, 2017

(65) Prior Publication Data
US 2018/0308863 A1    Oct. 25, 2018

(30) Foreign Application Priority Data

Jan. 14, 2016 (CN) .......................... 2016 1 0024086

(51) Int. Cl.
*H01L 27/12* (2006.01)
*G02F 1/1343* (2006.01)
(Continued)

(52) U.S. Cl.
CPC .......... *H01L 27/124* (2013.01); *G02F 1/1368* (2013.01); *G02F 1/133753* (2013.01);
(Continued)

(58) Field of Classification Search
CPC ............... H01L 27/3248; H01L 27/124; H01L 29/41733; H01L 29/42384;
(Continued)

(56) References Cited

U.S. PATENT DOCUMENTS 9,728,558 B2    8/2017  Shen
2009/0002618 A1*  1/2009  Lee .................. G02F 1/133707
                                                349/129
(Continued)

FOREIGN PATENT DOCUMENTS

CN    102662286 A    9/2012
CN    103176320 A    6/2013
CN    204302633 U    4/2015

OTHER PUBLICATIONS

International Search Report and Written Opinion dated Sep. 27, 2016 in PCT/CN2016/088165.
(Continued)

*Primary Examiner* — Sonya D. McCall-Shepard
(74) *Attorney, Agent, or Firm* — Syncoda LLC; Feng Ma

(57) ABSTRACT

An array substrate includes: a plurality of pixels including sub-pixels forming a matrix, each sub-pixel including a pair of sub-pixel portions; a plurality of data lines; a plurality of gate lines intersecting with the plurality of data lines; and a plurality of pairs of transistors configured to control the plurality of pairs of sub-pixel portions; wherein: each pair of transistors are disposed adjacent to an intersection between a gate line and a data line, across at least one of the gate line
(Continued)

or the data line, and are configured to control a pair of sub-pixel portions in neighboring rows or columns of sub-pixel portions.

19 Claims, 10 Drawing Sheets

(51) Int. Cl.
    *G02F 1/1362*     (2006.01)
    *G02F 1/1337*     (2006.01)
    *H01L 29/417*     (2006.01)
    *H01L 29/423*     (2006.01)
    *G02F 1/1368*     (2006.01)

(52) U.S. Cl.
    CPC .. *G02F 1/134309* (2013.01); *G02F 1/136286* (2013.01); *H01L 29/41733* (2013.01); *H01L 29/42384* (2013.01); *G02F 2001/134345* (2013.01); *G02F 2201/121* (2013.01); *G02F 2201/123* (2013.01)

(58) Field of Classification Search
    CPC ....... G02F 2001/136245; G02F 1/1368; G02F 1/136286; G02F 1/134309; G02F 1/133753; G02F 2201/121; G02F 2201/123
    See application file for complete search history.

(56) References Cited

U.S. PATENT DOCUMENTS

2014/0118652 A1    5/2014   Zhang et al.
2015/0268517 A1*   9/2015   Song ................ G02F 1/134309
                                                         349/43
2016/0357073 A1   12/2016   Zhang et al.

OTHER PUBLICATIONS

First Office Action dated Apr. 25, 2018 in CN201610024086.0.
Second Office Action dated Nov. 6, 2018 in CN201610024086.0.
Third Office Action dated Mar. 29, 2019 in CN201610024086.0.

* cited by examiner

ARRAY SUBSTRATE, DISPLAY PANEL, AND DISPLAY APPARATUS

CROSS-REFERENCE TO RELATED APPLICATION

The present application claims priority to Chinese Patent Application No. 201610024086.0 filed on Jan. 14, 2016, the disclosure of which is hereby incorporated by reference in its entirety.

TECHNICAL FIELD

The present disclosure relates generally to the field of display technologies, and more specifically to an array substrate, a display panel, and a display apparatus.

BACKGROUND

Liquid crystal displays (LCDs), light-emitting diode (LED) displays, or organic LED (OLED) displays have advantages such as low radiation, small size, and high energy efficiency, and have gradually replaced the traditional cathode ray tube (CRT) displays in applications such as notebook computers, personal digital assistants (PDA), flat-panel TVs, or mobile phones.

Through an In-Plane Switching (IPS) mode, a Fringe Field Switching (FFS) mode, or an Advanced Super Dimension Switch (ADS) mode, an LCD apparatus provides a wide viewing angle. In the LCD structure, the pixel electrodes and the common electrodes are arranged on a same substrate, which generate electric field force in the horizontal direction to change the directional angle between the optical axis of the liquid crystal molecules and the surface in parallel with the substrate so as to drive the LCD.

SUMMARY

At least some of the embodiments disclosed herein solve at least some of the problems associated with current display panels recognized by the inventors of the present disclosure, as described in more detail below. For example, one problem is associated with disclination, and current technologies employ more gate lines and/or more thin-film transistors to independently drive the pixel electrodes in the two domains, causing non-transparent metal layers to occupy more display area and leading to a decreased pixel opening rate.

In an aspect, an array substrate is provided, including: a plurality of pixels including sub-pixels forming a matrix, each sub-pixel including a pair of sub-pixel portions; a plurality of data lines; a plurality of gate lines intersecting with the plurality of data lines; and a plurality of pairs of transistors configured to control the plurality of pairs of sub-pixel portions; wherein: each pair of transistors are disposed adjacent to an intersection between a gate line and a data line, across at least one of the gate line or the data line, and are configured to control a pair of sub-pixel portions in neighboring rows or columns of sub-pixel portions.

In some embodiments, each of the plurality of sub-pixels includes two pixel electrodes corresponding to the pair of sub-pixel portions; the pair of sub-pixel portions form a dual-domain configuration; the two pixel electrodes are insulated from one another, and have opposite domain tilt directions; the plurality of data lines alternate with the plurality of columns of sub-pixel portions such that one data line is arranged between two neighboring columns of sub-pixel portions; and one gate line is arranged between two rows of sub-pixel portions.

In some embodiments, the pair of transistors are disposed across both the gate line and the data line.

In some embodiments, for each pair of transistors, gate electrodes of the pair of transistors are integrated and are coupled with the gate line; source electrodes of the pair of transistors are disposed over the data line; and drain electrodes of the pair of transistors are respectively disposed at two sides of the data line.

In some embodiments, the drain electrodes of each pair of transistors are respectively coupled with two pixel electrodes diagonally disposed in two neighboring columns of sub-pixel portions.

In some embodiments, the two pixel electrodes diagonally located in two neighboring columns of sub-pixel portions comprise a first pixel electrode on an anterior row and on an even-numbered column, and a second pixel electrode on a posterior row and on an odd-numbered column.

In some embodiments, the two pixel electrodes diagonally located in two neighboring pixel units on a same row of pixel units comprises a first pixel electrode on an anterior row and on an odd-numbered column, and a second pixel electrode on a posterior row and on an even-numbered column.

In some embodiments, the pair of transistors are disposed across the gate line and at one side of the data line.

In some embodiments, for each pair of transistors, gate electrodes of the pair of transistors are integrated and are coupled with the gate line; source electrodes of the pair of transistors both are disposed over the data line; and drain electrodes of the pair of transistors are respectively disposed at two sides of the gate line and are integrated.

In some embodiments, the drain electrodes of each pair of transistors are respectively coupled with two pixel electrodes in a same column.

In some embodiments, the pair of transistors are disposed across the data line and at one side of the gate line.

In some embodiments, each pair of transistors are configured to control two pixel electrodes located on the one side of the gate line in two neighboring sub-pixel portions on a same row.

In some embodiments, the plurality of data lines are parallel to each other and the plurality of gate lines are parallel to each other.

In some embodiments, the array substrate further includes a plurality of common electrode lines disposed in rows and alternating with the plurality of gate lines.

In some embodiments, the plurality of common electrode lines are parallel to each other.

In some embodiments, each pair of transistors are integrally formed.

In some embodiments, the transistors are thin-film transistors (TFTs).

In some embodiments, each TFT further includes an active layer disposed between a gate electrode layer and a layer of source electrode and drain electrode.

In another aspect, a display panel is provided, including the array substrate described above.

In another aspect, a display apparatus is provided, including the display panel described above.

Other embodiments and implementations will become apparent in view of the following drawings and descriptions.

BRIEF DESCRIPTION OF DRAWINGS

The following drawings are merely examples for illustrative purposes according to various disclosed embodiments and are not intended to limit the scope of the present disclosure.

DETAILED DESCRIPTION

Figure 1A:
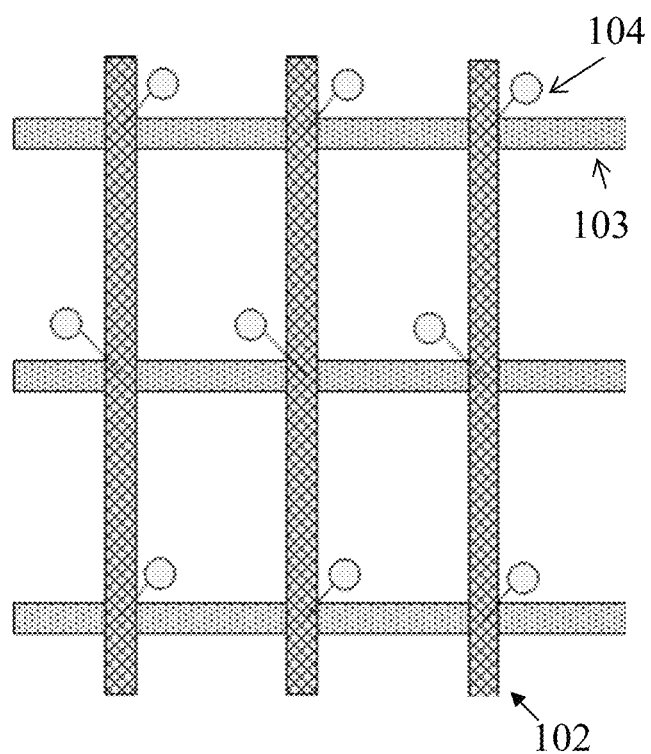
FIG. 1A is a schematic diagram of a conventional array substrate.

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

Display panels are desired to have high resolutions, narrow boarders, and low energy consumptions. To reduce the energy consumption, "Z" pattern reversal designs can be adopted. To improve the resolution, the number of scan lines (e.g., gate lines) may need to be increased significantly, leading to limited space for Gate Drive on Array (GOA), thereby requiring broader boarders of the display panel.

The single-domain LCD technology has been widely employed due to its advantages including wide viewing angle, small color cast, and low energy consumption, etc. Yet with customers' increasing demands for display performances, the disadvantages of the single-domain technology such as viewing-angle-dependent color shift and poor contrast have become more and more prominent, prompting the emergence of dual-domain LCD technologies.

In the dual-domain technologies, each sub-pixel area is split into two domains, and the mutual compensation of the liquid crystal molecules in the two domains greatly improves the optical performance of the LCD apparatus at large viewing angles. In addition, dual-domain displays no longer need thick polarizers for viewing angle compensation, in turn satisfying the market needs for thinner LCDs.

Despite of the improvements in viewing angles resulting from current dual-domain structures, in some cases liquid crystal molecules at the junction between the two domains of the sub-pixel area are unable to change orientation because the electric fields formed by the pixel electrodes in the two domains have equal strength yet opposite directions along the vertical axis. Consequently, the liquid crystal molecules at the junction between the two domains of the sub-pixel area are incapable of changing the polarization direction of linearly polarized light, leading to the inability of light from the light source to pass through the upper polarizer at a gray scale other than zero, manifested as a dark line at the junction between the two domains of the pixel area.

In a similar way, the liquid crystal molecules at the proximity of the junction are also influenced and are difficult to change orientation due to the close strength of the electric fields formed by the pixel electrodes in the two domains, creating a phenomenon termed disclination, which results in a dark region (or a disclination region) having a certain area at the junction between the two domains.

In order to correct disclination, the pixel electrodes in the two domains can be arranged to be insulated from each other, and are thereby driven independently. Independent driving of the pixel electrodes in the two domains, however, requires more gate lines and/or more thin-film transistors (TFTs), causing non-transparent metal layers to occupy more display area and thereby leading to a reduced pixel opening rate.

Increasing the pixel opening rate demands reducing the number of common electrodes within the panel. With reduced number of common electrodes within the panel, the uniformity and stability of the voltages across the common electrodes in the display panel may be affected.

In order to reduce energy consumption of a display panel, currently a "Z"-pattern design (shown in FIG. 1A) is commonly employed in the configuration of the TFTs. Neighboring rows of TFTs 104 are arranged at two sides of each data line 102, at intersections with each gate line 103, and are configured to control two neighboring rows of pixel electrodes.

Figure 1B:
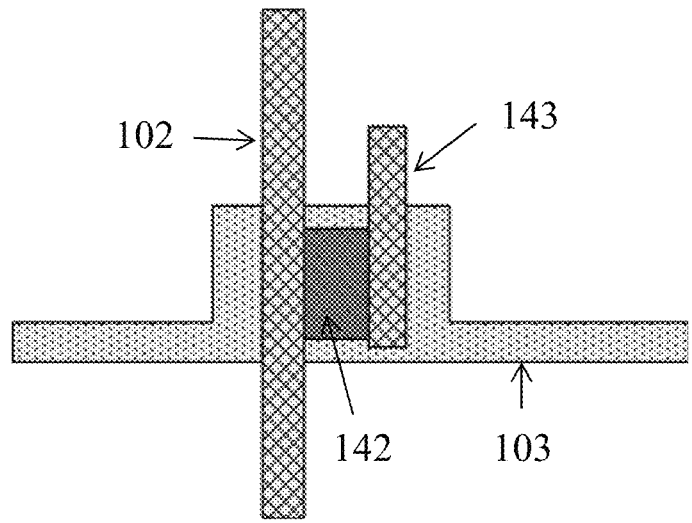
FIG. 1B is a magnified view of a portion of the array substrate of FIG. 1A.
Figure 1C:
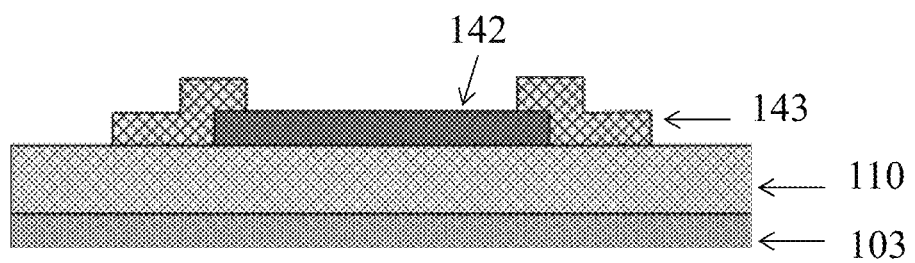
FIG. 1C is a cross-sectional view of the portion of the array substrate of FIG. 1B.

Each of the TFT 104 shown in FIG. 1B and FIG. 1C has its gate electrode and source electrode coupled with a gate line 103 and a data line 102, respectively, and has its drain electrode 143 coupled with the pixel electrode. Each of the TFT 104 can have an active layer 142 disposed between the gate electrode insulating layer 110 and the layer where the source electrode and drain electrode are located.

With references to FIGS. 2-11, according to some embodiments of the disclosure, neighboring rows of TFTs can be integrated together, for example, forming integral pairs of TFTs. As such, the number of gate lines, or scan lines, can be reduced by half, and the extra space as saved by reducing the number of scan lines in the display panel can be used for common electrode lines.

In addition, as a result of the reduction in the number of scan lines, the number of GOA can also be reduced by half, allowing for more space for the GOA patterning, thereby achieving a narrower-boarder design. The display panels according to some embodiments disclosed herein therefore can have narrow boarders, low energy consumptions, and more uniform voltages across the common electrodes.

Figure 2:
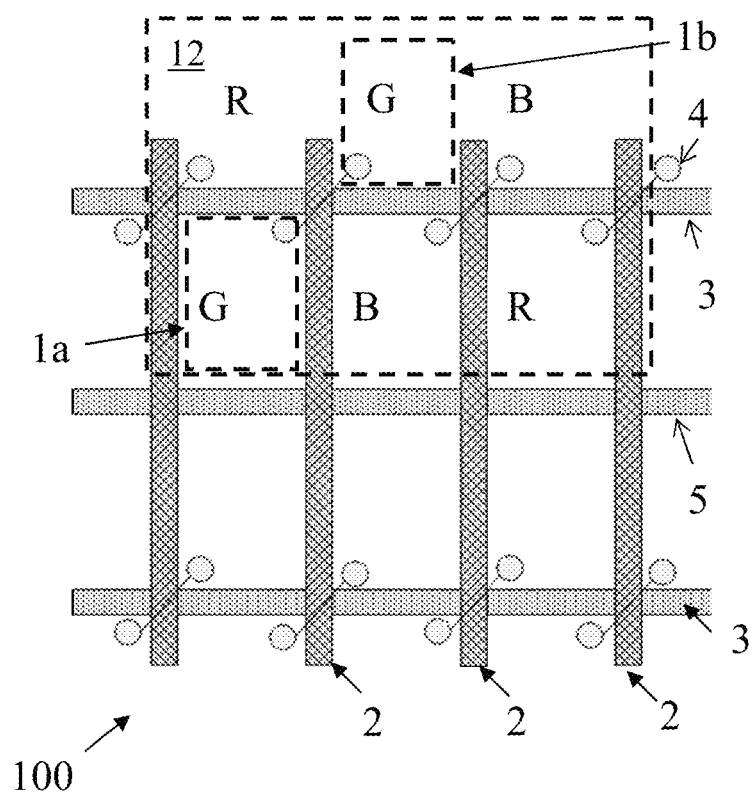
FIG. 2 is a schematic diagram of an array substrate according to some embodiments of the disclosure.

For example, as illustrated in FIG. 2, a display apparatus 100 comprises a plurality of pixels 12 forming a matrix. Each pixel 12 comprises a plurality of sub-pixels, such as red (R), green (G), and blue (B). Each sub-pixel can have a plurality of portions, forming a multi-domain configuration. For example, in a dual-domain configuration, a sub-pixel G can include a pair of portions 1a, 1b. Each sub-pixel portion 1a or 1b can have a pixel electrode. The plurality of sub-pixel portions form columns and rows.

A plurality of rows of gate lines 3 interlace with a plurality of common electrode lines 5. A plurality of columns of data lines 2 intersect the plurality of gate lines 3 and the plurality of common electrode lines 5.

A plurality of pairs of transistors (e.g., TFTs) 4 are configured to control the plurality of pixels 12. Each pair can be integrally formed. In the embodiment illustrated in FIG. 2, each pair of transistors 4 are disposed across a gate line 3, and configured to control a pair of diagonally-arranged subpixel portions, such as 1a, 1b, in neighboring rows of sub-pixel portions. The pair of transistors 4 as shown also are disposed across the data line 2.

It is noted that the definitions of "rows" and "columns" are relative, and may be interchangeable.

Figure 3:
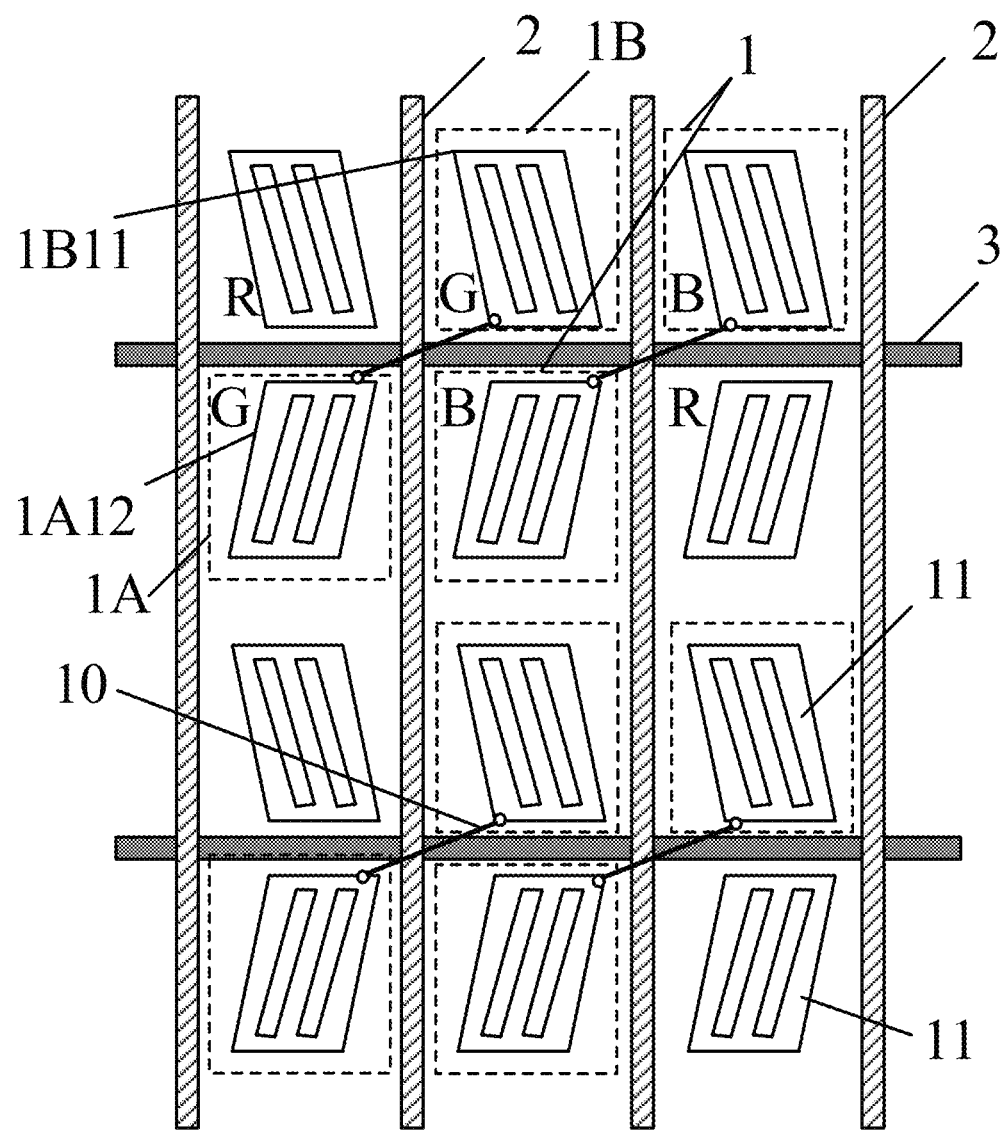
FIG. 3 is a partial view of a schematic diagram of an array substrate according to a first embodiment of the disclosure.

FIG. 3 illustrates an array substrate according to some embodiments of the disclosure. The array substrate comprises a plurality of pixels including a plurality of sub-pixels 1, each sub-pixel having a dual-domain structure including sub-pixel portions 1A, 1B. The sub-pixel portions 1A, 1B are arranged in an matrix having rows and columns. Each sub-pixel has two pixel electrodes 11 disposed generally along a direction of the columns. The two pixel electrodes 11 are insulated from each other and have opposite domain tilt directions. Each column of the sub-pixel portions (e.g., 1A, 1B) can be provided with one data line 2 at each of the two sides of the column. According to some embodiments, only one data line 2 is arranged between two columns of the sub-pixel portions 1A, 1B.

A gate line 3 can be disposed between two rows of the pixel electrodes 11. The gate line 3 can be shared by the two rows of the pixel electrodes 11.

The two pixel electrodes 11 of each sub-pixel 1 are respectively coupled with the two neighboring data lines 2, and the data lines 2 respectively coupled with the two pixel electrodes 11 are interlaced. According to some embodiments, only one group of diagonally arranged two pixel electrodes 11 of any two neighboring sub-pixel portions 1A, 1B share the data line 2 between the two neighboring sub-pixel portions 1A, 1B.

As illustrated in FIG. 3, of the two diagonally-disposed adjacent sub-pixel portions 1A, 1B, the pixel electrode 1B11 on an anterior row and on an even-numbered column, and the pixel electrode 1A12 on a posterior row and on an odd-numbered column share the data line 2 disposed between the two sub-pixel portions 1A, 1B.

It is noted that part of the structure in FIG. 3 is simplified in the illustration for better understanding of the configuration. A simplified connection structure 10 is shown to describe the coupling between the two pixel electrodes 11 that share a common gate line 3 and share a common data line 2.

Figure 4:
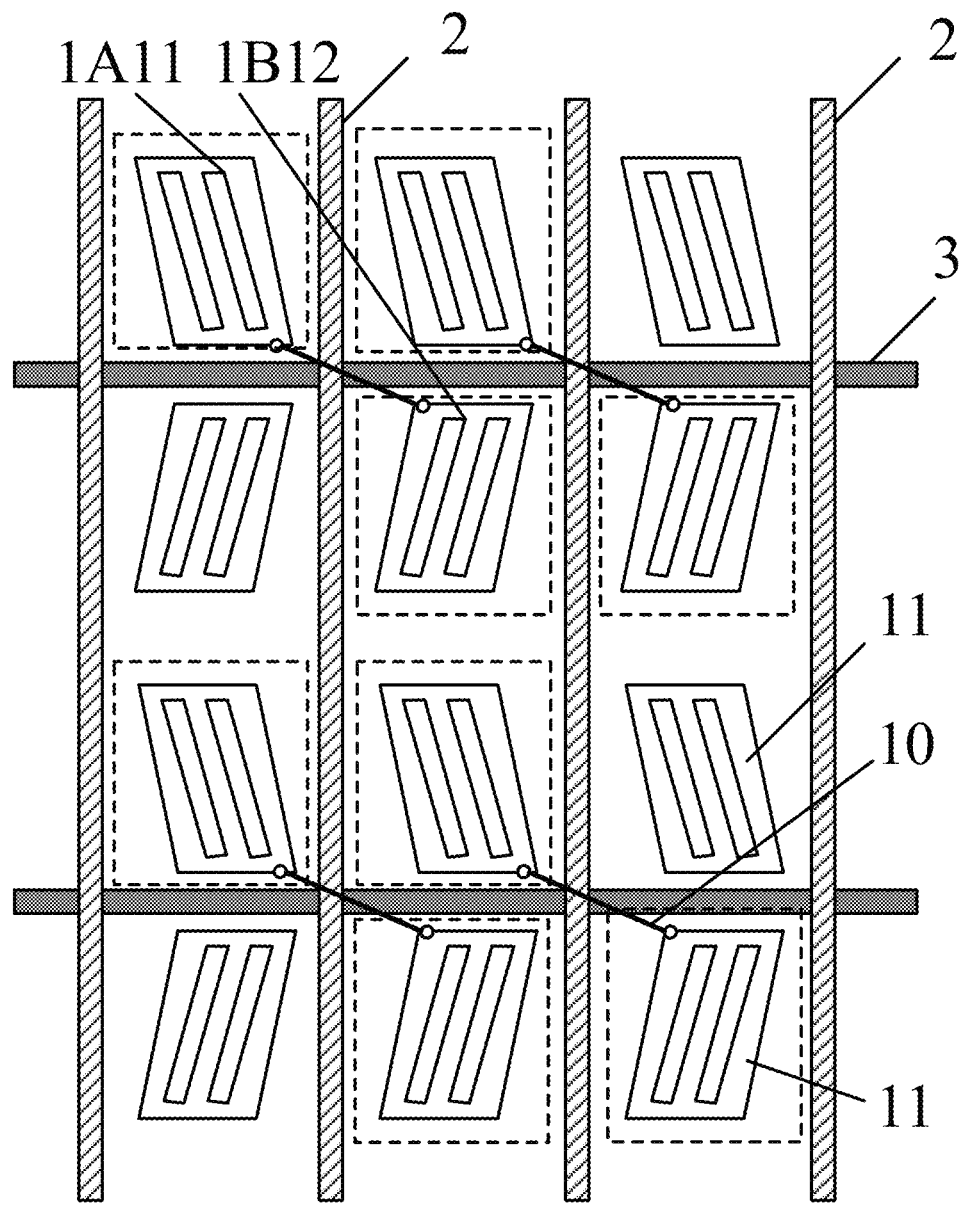
FIG. 4 is a partial view of a schematic diagram of an array substrate according to a second embodiment of the disclosure.

Alternatively, as illustrated in FIG. 4, respectively for the two diagonally-disposed sub-pixel portions, the pixel electrode 1A11 on an anterior row and on an odd-numbered column, and the pixel electrode 1B12 on a posterior row and on an even-numbered column share the data line 2 arranged between the two diagonally-disposed sub-pixel portions.

Figure 5:
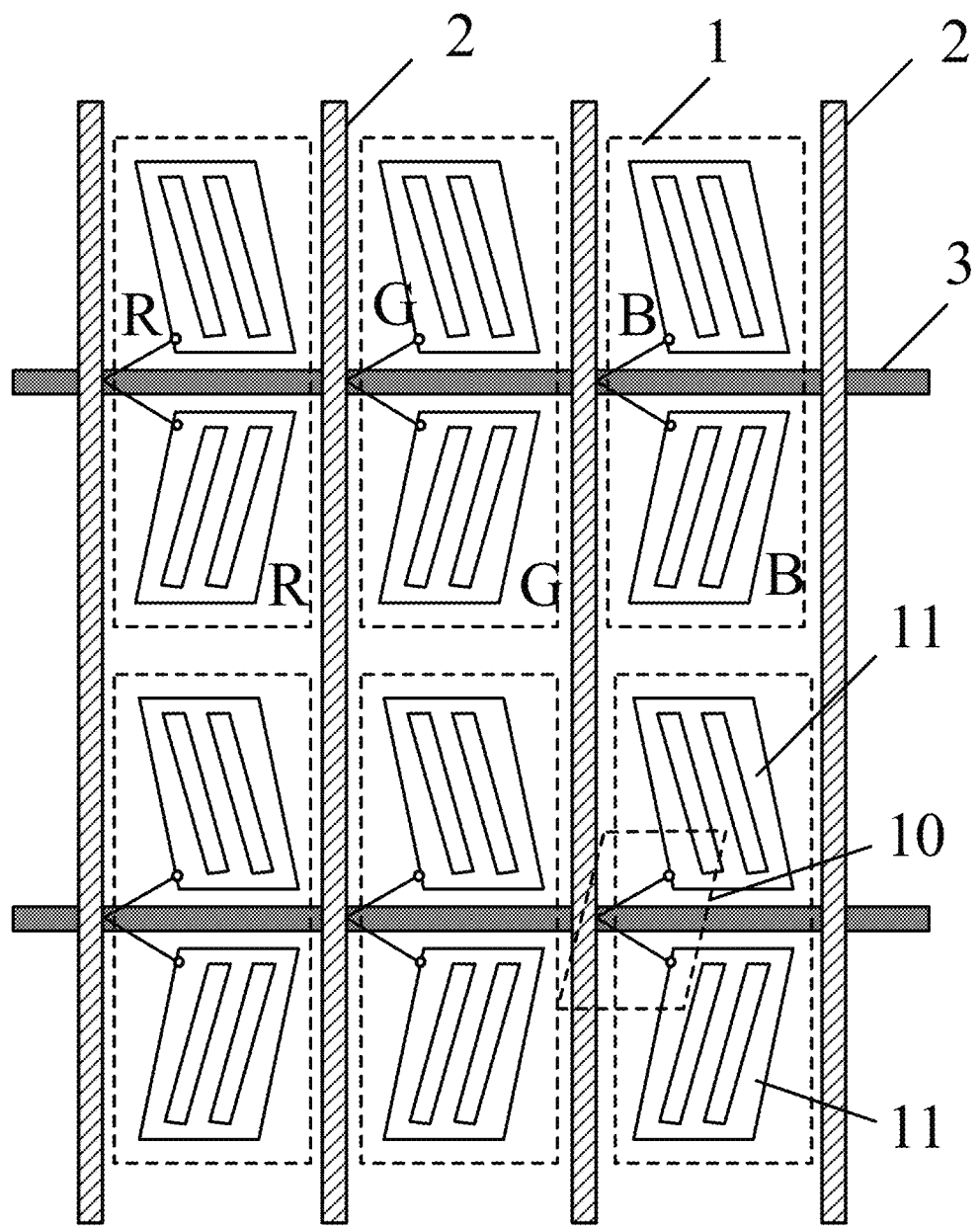
FIG. 5 is a partial view of a schematic diagram of an array substrate according to a third embodiment of the disclosure.

In another embodiment as shown in FIG. 5, each sub-pixel has two portions both disposed in the column, rather than diagonally as in the embodiments illustrated in FIGS. 2-4. The two pixel electrodes 11 of a sub-pixel are coupled with, and share, one of the two neighboring data lines 2.

In the embodiment shown in FIG. 5, the two pixel electrodes 11 of a same sub-pixel 1 are configured to share a common data line 2 and a common gate line 3. Alternatively, the pixel electrodes 11 that belong to different sub-pixels can be configured to share a common data line 2 and a common gate line 3. In these configurations, the number of gate lines 3 needed for driving the display panel can be reduced, thereby decreasing the area in the display region of the pixels 1 that is occupied by the non-transparent metal layers, leading to an increased pixel opening ratio.

Figure 6:
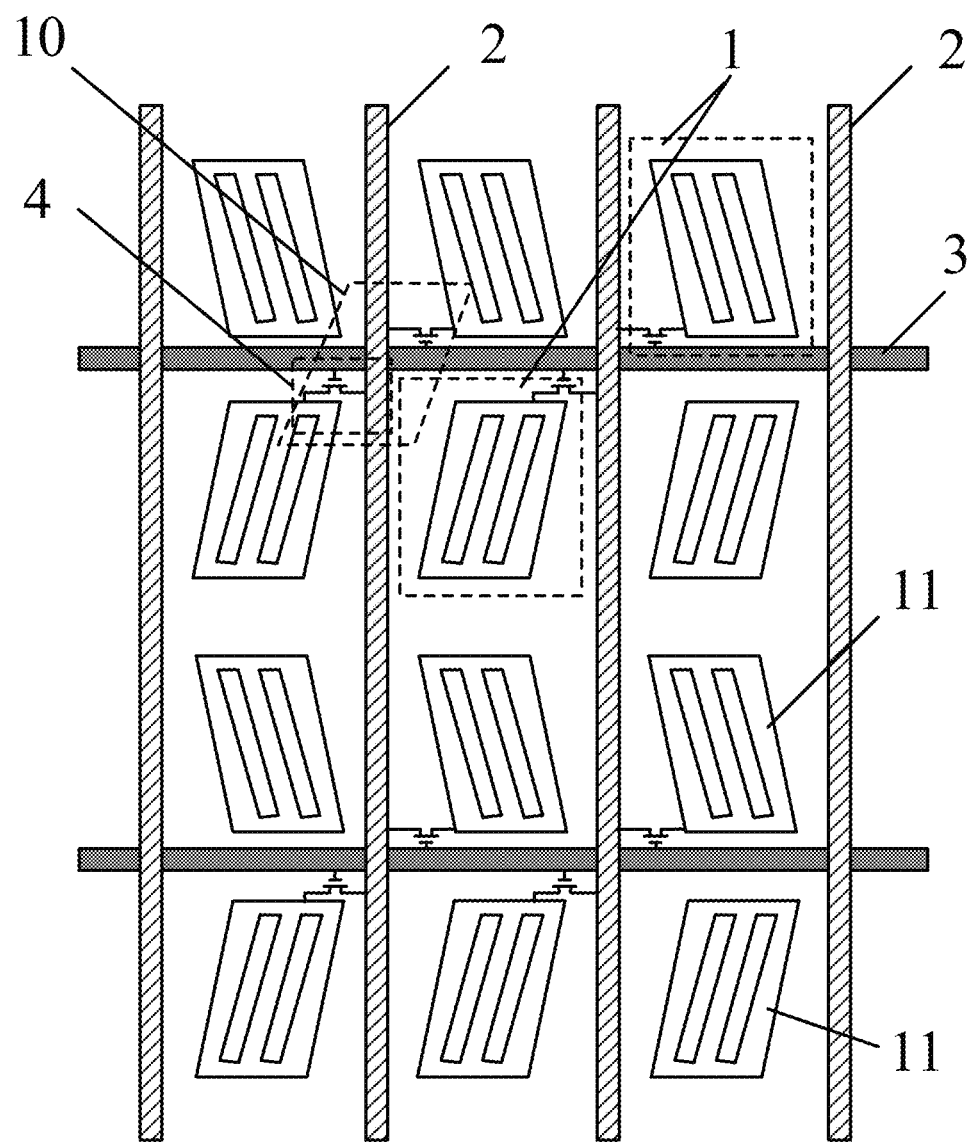
FIG. 6 is a schematic diagram illustrating the connection between the thin-film transistors and the pixel electrodes in the array substrate according to the first embodiment of the disclosure.

As shown in FIG. 6, in order to drive each of the pixel electrodes 11, the array substrate is provided with a plurality of TFTs that correspond to the pixel electrodes 11. As such, each sub-pixel comprises two TFTs 4, corresponding respectively to the two pixel electrodes 11 in the same sub-pixel 1.

In some embodiments, the gate electrodes and the source electrodes can also be shared by the two TFTs 4 corresponding to the two pixel electrodes 11 that share a same gate line 3 and a same data line 2, thereby reducing the area in the display region of the sub-pixel that is occupied by the thin-film transistors 4, leading to an increased pixel opening ratio.

Figure 7:
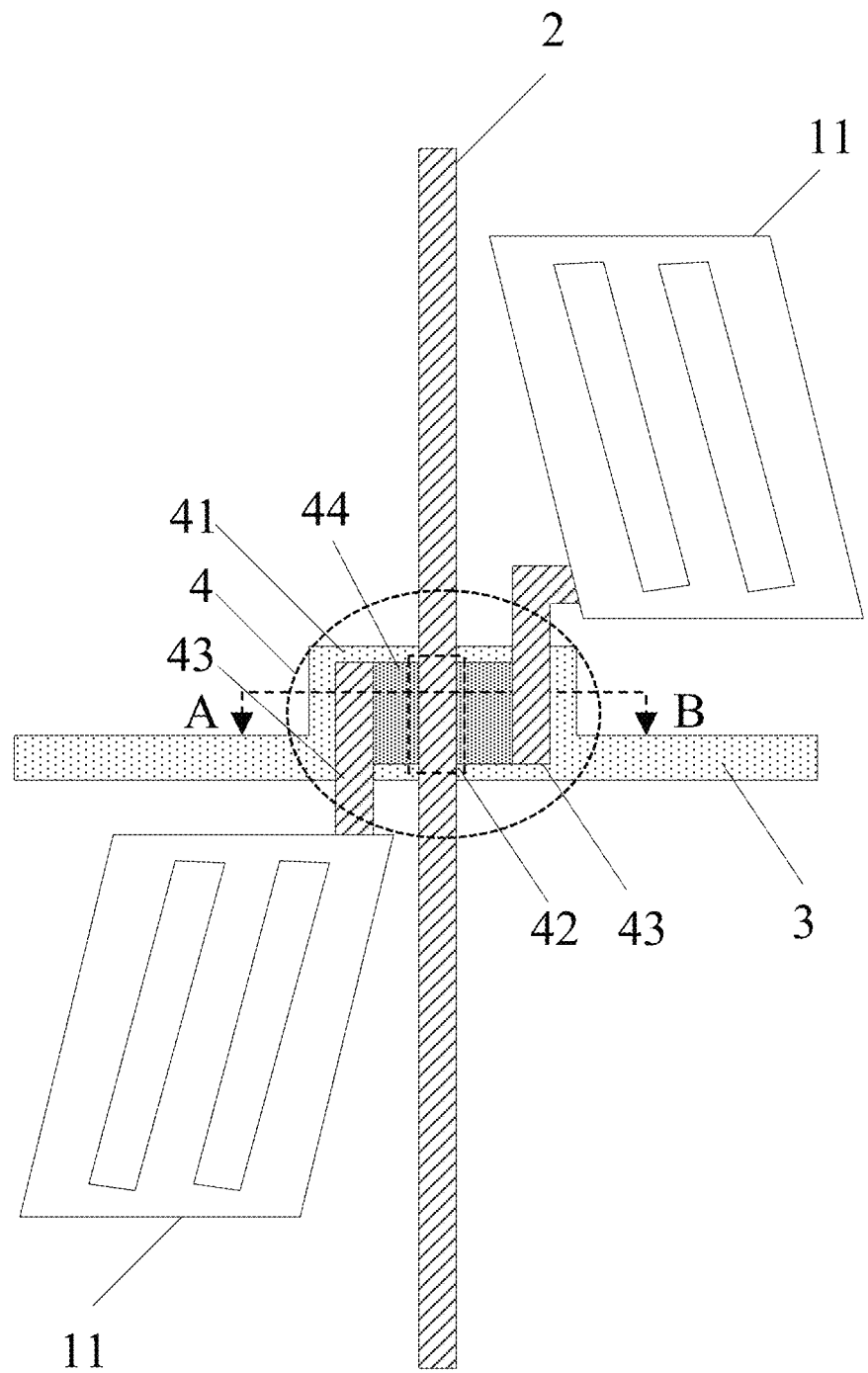
FIG. 7 illustrates the structure of the two pixel electrodes sharing a common gate line and a common data line in the array substrate as shown in FIG. 6.

FIG. 7 illustrates a structure of two pixel electrodes 11 sharing a common gate line 3 and a common data line 2 in the array substrate as shown in FIG. 6. The gate electrodes 41 of the two thin-film transistors 4 corresponding to the two pixel electrodes 11 sharing a common gate line 3 and a common data line 2 are integrated, and the source electrodes 42 of the two thin-film transistors 4 are coupled, and are disposed over the common data line 2.

As seen from the projected view, the projection of the source electrodes 42 fall onto the projection of the common data line 2. In some embodiments, the source electrodes 42 overlap with the common data line 2. In some embodiments, the source electrodes 42 can be part of the common data line 2.

The two pixel electrodes 11 sharing a common gate line 3 and a common data line 2 belong to different columns of sub-pixel portions (see FIG. 3 and FIG. 4), and thus the drain electrodes 43 of the two thin-film transistors 4 corresponding to the two pixel electrodes 11 sharing a common gate line 3 and a common data line 2 are respectively disposed at the two sides of the common data line 2.

Each of the TFTs 4 further comprises an active layer 44, disposed between the layer of gate electrode 41 and the layer of source electrode 42 and drain electrode 43.

Figure 8:
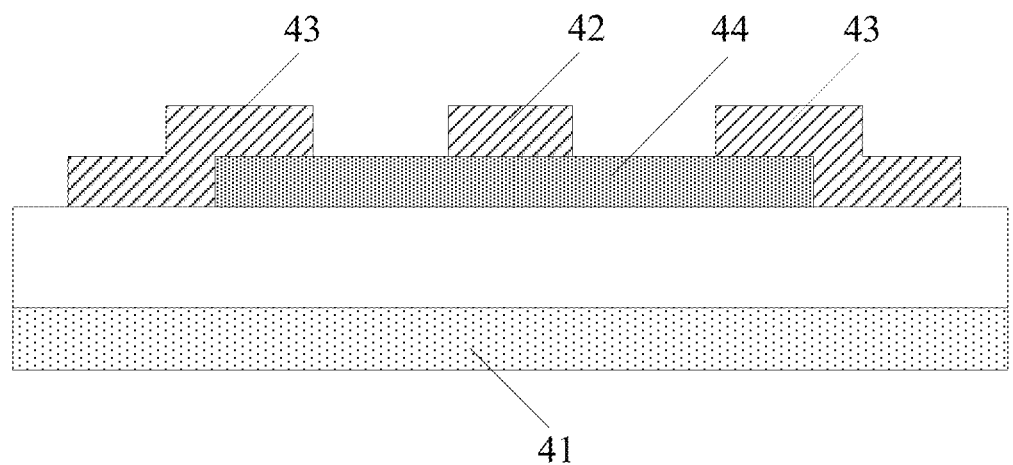
FIG. 8 is a cross-sectional view of A and B as shown in FIG. 7.

FIG. 8 provides a cross-sectional view along the line AB FIG. 7. Correspondingly, the TFTs 4 in the array substrate as shown in FIG. 4 can have a similar structure.

In the embodiments, the drain electrodes 43 of the two TFTs 4 for the two sub-pixel portions sharing a common gate line 3 and a common data line 2 respectively form independent TFTs 4 with the shared data line 2, which can ensure a controlling capability of the TFTs 4.

Figure 9:
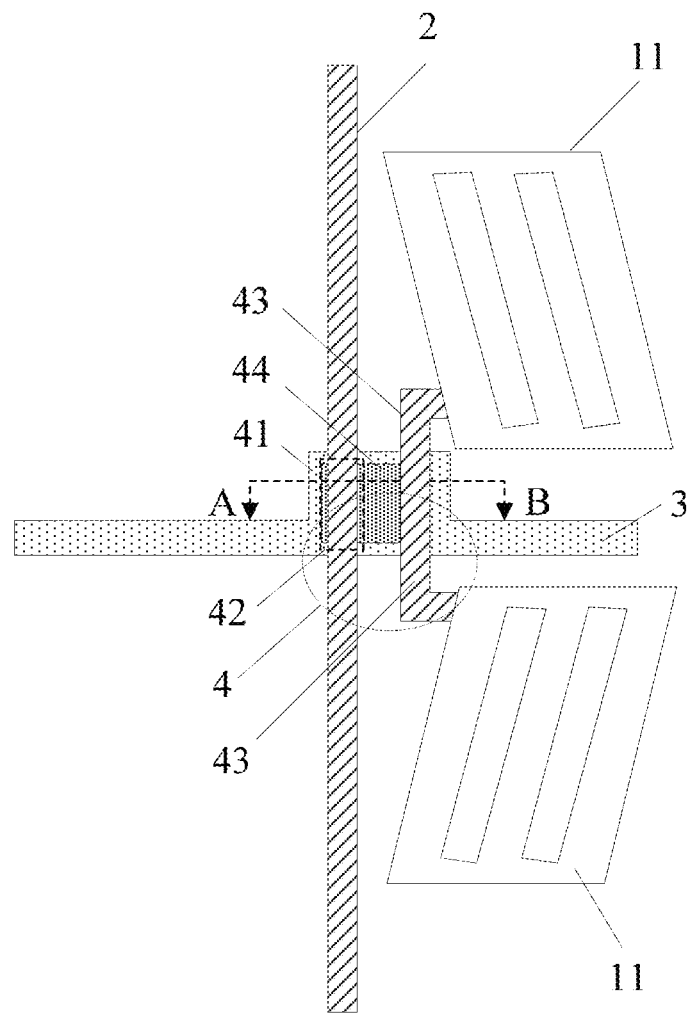
FIG. 9 illustrates the structure of two pixel electrodes sharing a common gate line and a common data line in the array substrate as shown in FIG. 5.

FIG. 9 illustrates the structure of two pixel electrodes 11 sharing a common gate line 3 and a common data line 2 in the array substrate as shown in FIG. 5. The gate electrodes 41 of the TFTs 4 corresponding to the two pixel electrodes 11 sharing a common gate line 3 and a common data line 2 are integrated, and the source electrodes 42 of the two thin-film transistors 4 are coupled in the common data line 2. In this embodiment, the two pixel electrodes 11 sharing a common gate line 3 and a common data line 2 are of a sub-pixel along the column direction (see FIG. 5) rather than in a diagonal direction.

The drain electrodes 43 of the two TFTs 4 corresponding to the two pixel electrodes 11 sharing a common gate line 3 and a common data line 2 can be integrated. Each of the TFTs 4 further comprises an active layer 44, arranged between the layer of gate electrode 41 and the layer of source electrode 42 and drain electrode 43.

Figure 10:
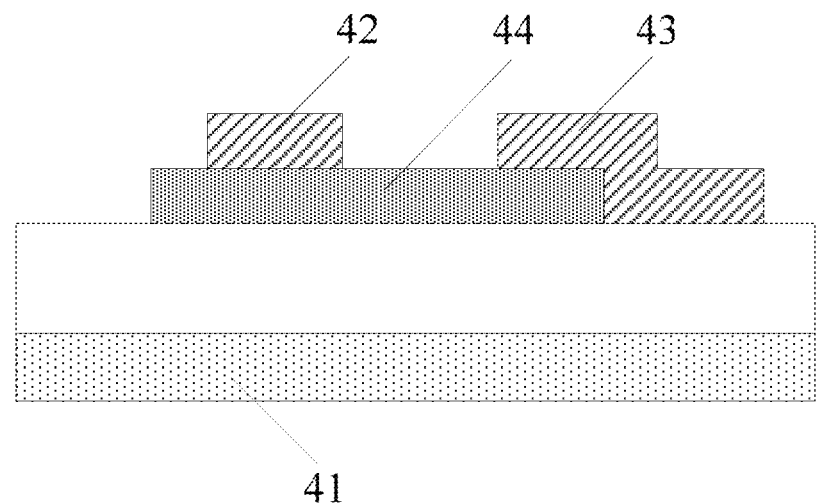
FIG. 10 is a cross-section view of A and B as shown in FIG. 9.

FIG. 10 provides a cross-sectional view along the line AB of FIG. 9. In this embodiment, the drain electrodes of the two TFTs 4 sharing a common gate electrode and a common source electrode can be integrated, thereby reducing the area of the display region of the sub-pixel occupied by the drain electrodes of the thin-film transistors, further leading to an increased pixel opening ratio.

Figure 11:
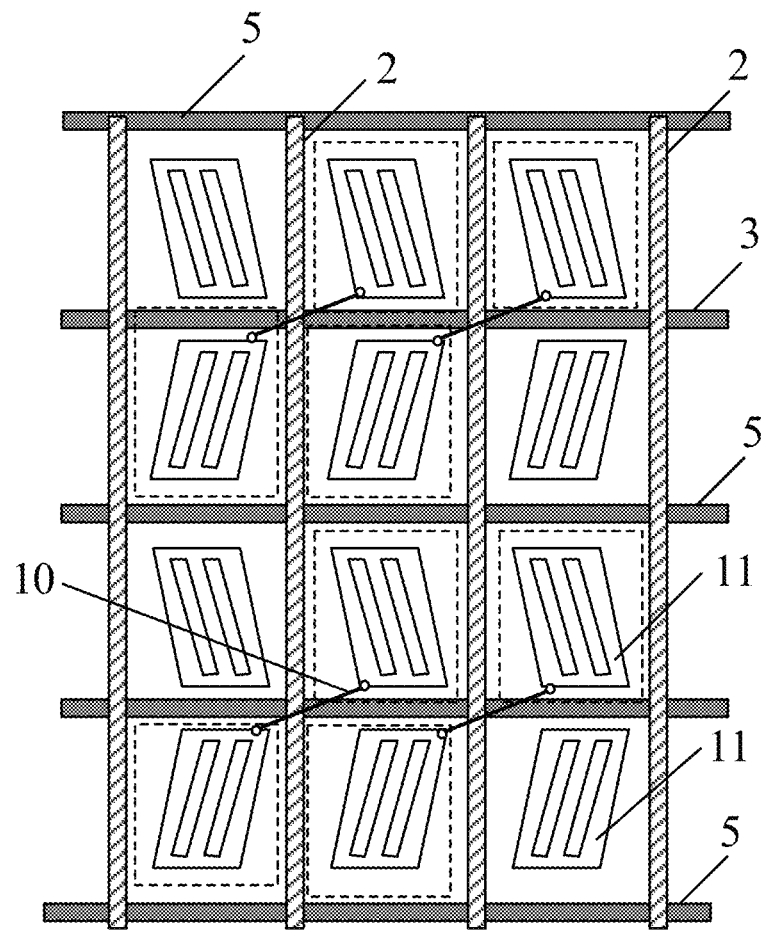
FIG. 11 is a partial view of the schematic diagram of the array substrate as shown in FIG. 3.

As shown in FIG. 11, a common electrode line 5 can be disposed between two neighboring rows of sub-pixel portions. In this embodiment, the common electrode line 5 between two neighboring rows of sub-pixel portions can ensure an even overall distribution of the common electrode lines 5, which can in turn ensure an even distribution of voltage over each individual sub-pixel portions.

In some embodiments, all data lines 2 are parallel to each other, and all gate lines 3 are parallel to each other. Other configurations are possible.

The array substrate according to some embodiments can have one or more of the following advantages. In the sub-pixel having a dual-domain structure, the two pixel electrodes of the same sub-pixel a long the column direction can share a common data line and a common gate line. Alternatively, the pixel electrodes of the same sub-pixel having diagonally-arranged sub-pixel portions can be configured to share a common data line and a common gate line.

As such, the number of gate lines needed for driving the dual-domain pixel units can be reduced, and the area in the display region of the sub-pixels that is occupied by non-transparent metal layers can be reduced, in turn leading to an increased pixel opening ratio.

The present disclosure also provides a display panel, which comprises the array substrate according to the embodiments as disclosed above.

The display panel according to some embodiments can have one or more of the following advantages. In a sub-pixel having dual-domain structure, the two pixel electrodes of a same sub-pixel having two sub-pixel portions along a column direction can be configured to share a common data line and a common gate line. Alternatively, the two pixel electrodes of a same sub-pixel having two diagonally-arranged sub-pixel portions can be configured to share a common data line and a common gate line. This configurations thereby reduce the number of gate lines needed for driving the dual-domain pixel units, and decrease the area in the display region of the pixel units that is occupied by non-transparent metal layers, in turn leading to an increased pixel opening ratio.

The present disclosure also provides a display apparatus, which comprises the display panel according to the embodiment as disclosed above.

The display apparatus according to some embodiments can have one or more of the following advantages. In the sub-pixel having a dual-domain structure, the two pixel electrodes of a same sub-pixel having two sub-pixel portions in the same column can be configured to share a common data line and a common gate line. Alternatively, the pixel electrodes of a same sub-pixel having sub-pixel portions arranged diagonally in neighboring columns can be configured to share a common data line and a common gate line. These configurations thereby reduce the number of gate lines needed for driving the dual-domain pixel units, and decrease the area in the display region of the pixel units that is occupied by non-transparent metal layers, in turn leading to an increased pixel opening ratio.

The display apparatus according to some embodiments disclosed herein can be an LCD, an LED display such as an active matrix OLED (AMOLED) display, or other types of the displays that can take advantages of the circuitry described above.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An array substrate, comprising:
   a plurality of pixels including sub-pixels forming a matrix, each sub-pixel including a pair of sub-pixel portions of domains of the each sub-pixel;
   a plurality of data lines;
   a plurality of gate lines intersecting with the plurality of data lines; and
   a plurality of pairs of transistors configured to control the plurality of pairs of sub-pixel portions;
   wherein:
      each pair of transistors are disposed adjacent to an intersection between a gate line and a data line, across at least one of the gate line or the data line, and are configured to control a pair of sub-pixel portions in neighboring rows or columns of sub-pixel portions;
      each of the plurality of sub-pixels comprises two pixel electrodes corresponding to the pair of sub-pixel portions;
      the pair of sub-pixel portions form a dual-domain configuration;
      the two pixel electrodes are insulated from one another, and have opposite domain tilt directions;
      the plurality of data lines alternate with the plurality of columns of sub-pixel portions such that one data line is arranged between two neighboring columns of sub-pixel portions; and
      one gate line is arranged between two rows of sub-pixel portions.

2. The array substrate of claim 1, wherein the pair of transistors are disposed across both the gate line and the data line.

3. The array substrate of claim 2, wherein for each pair of transistors,
   gate electrodes of the pair of transistors are integrated and are coupled with the gate line;
   source electrodes of the pair of transistors are disposed over the data line; and
   drain electrodes of the pair of transistors are respectively disposed at two sides of the data line.

4. The array substrate of claim 3, wherein the drain electrodes of each pair of transistors are respectively coupled with two pixel electrodes diagonally disposed in two neighboring columns of sub-pixel portions.

5. The array substrate of claim 4, wherein the two pixel electrodes diagonally located in two neighboring columns of sub-pixel portions comprise a first pixel electrode on a first row and on an even-numbered column, and a second pixel electrode on a second row and on an odd-numbered column.

6. The array substrate of claim 4, wherein the two pixel electrodes diagonally located in two neighboring pixel units on a same row of pixel units comprises a first pixel electrode on a first row and on an odd-numbered column, and a second pixel electrode on a second row and on an even-numbered column.

7. The array substrate of claim 1, wherein the pair of transistors are disposed across the gate line and at one side of the data line.

8. The array substrate of claim 7, wherein for each pair of transistors,
gate electrodes of the pair of transistors are integrated and are coupled with the gate line;
source electrodes of the pair of transistors both are disposed over the data line; and
drain electrodes of the pair of transistors are respectively disposed at two sides of the gate line and are integrated.

9. The array substrate of claim 8, wherein the drain electrodes of each pair of transistors are respectively coupled with two pixel electrodes in a same column.

10. The array substrate of claim 1, wherein the pair of transistors are disposed across the data line and at one side of the gate line.

11. The array substrate of claim 10, wherein each pair of transistors are configured to control two pixel electrodes located on the one side of the gate line in two neighboring sub-pixel portions on a same row.

12. The array substrate of claim 1, wherein the plurality of data lines are parallel to each other and the plurality of gate lines are parallel to each other.

13. The array substrate of claim 1, further comprising a plurality of common electrode lines disposed in rows and alternating with the plurality of gate lines.

14. The array substrate of claim 13, wherein the plurality of common electrode lines are parallel to each other.

15. The array substrate of claim 1, wherein each pair of transistors are integrally formed.

16. The array substrate of claim 1, wherein the transistors are thin-film transistors (TFTs).

17. The array substrate of claim 16, wherein each TFT further comprises an active layer disposed between a gate electrode layer and a layer of source electrode and drain electrode.

18. A display panel, comprising an array substrate including:
a plurality of pixels including sub-pixels forming a matrix, each sub-pixel including a pair of sub-pixel portions of domains of the each sub-pixel;
a plurality of data lines;
a plurality of gate lines intersecting with the plurality of data lines; and
a plurality of pairs of transistors configured to control the plurality of pairs of sub-pixel portions;
wherein:
each pair of transistors are disposed adjacent to an intersection between a gate line and a data line, across at least one of the gate line or the data line, and are configured to control a pair of sub-pixel portions in neighboring rows or columns of sub-pixel portions;
each of the plurality of sub-pixels comprises two pixel electrodes corresponding to the pair of sub-pixel portions;
the pair of sub-pixel portions form a dual-domain configuration;
the two pixel electrodes are insulated from one another, and have opposite domain tilt directions;
the plurality of data lines alternate with the plurality of columns of sub-pixel portions such that one data line is arranged between two neighboring columns of sub-pixel portions; and
one gate line is arranged between two rows of sub-pixel portions.

19. A display apparatus, comprising a display panel having an array substrate, the array substrate comprising:
a plurality of pixels including sub-pixels forming a matrix, each sub-pixel including a pair of sub-pixel portions of domains of the each sub-pixel;
a plurality of data lines;
a plurality of gate lines intersecting with the plurality of data lines; and
a plurality of pairs of transistors configured to control the plurality of pairs of sub-pixel portions;
wherein:
each pair of transistors are disposed adjacent to an intersection between a gate line and a data line, across at least one of the gate line or the data line, and are configured to control a pair of sub-pixel portions in neighboring rows or columns of sub-pixel portions;
each of the plurality of sub-pixels comprises two pixel electrodes corresponding to the pair of sub-pixel portions;
the pair of sub-pixel portions form a dual-domain configuration;
the two pixel electrodes are insulated from one another, and have opposite domain tilt directions;
the plurality of data lines alternate with the plurality of columns of sub-pixel portions such that one data line is arranged between two neighboring columns of sub-pixel portions; and
one gate line is arranged between two rows of sub-pixel portions.

* * * * *